(12) United States Patent
Behziz et al.

(10) Patent No.: US 8,804,342 B2
(45) Date of Patent: Aug. 12, 2014

(54) COMMUNICATION MODULES HAVING CONNECTORS ON A LEADING END AND SYSTEMS INCLUDING THE SAME

(75) Inventors: Arash Behziz, Newbury Park, CA (US); Michael David Herring, Apex, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 218 days.

(21) Appl. No.: 13/402,337

(22) Filed: Feb. 22, 2012

(65) Prior Publication Data
US 2013/0215563 A1      Aug. 22, 2013

(51) Int. Cl.
*H05K 1/14* (2006.01)

(52) U.S. Cl.
USPC ............................. 361/736; 439/775

(58) Field of Classification Search
CPC ............... H05K 9/007; H05K 1/0215; H05K 2201/10386; H05K 2201/09145; H05K 5/0069; H05K 2201/10356; G06F 13/409; G06F 1/184; G06F 1/033; H05B 2203/013; H05B 3/0689
USPC ................... 361/736, 728–730, 692, 679.32, 361/679.37, 679.4; 439/492, 495, 595, 596, 439/775
See application file for complete search history.

(56) References Cited

U.S. PATENT DOCUMENTS

| | | | |
|---|---|---|---|
| 5,531,611 A * | 7/1996 | Reed et al. | 439/540.1 |
| 5,921,816 A * | 7/1999 | Larabell | 439/638 |
| 6,215,656 B1 * | 4/2001 | O'Neal et al. | 361/679.02 |
| 6,301,104 B1 * | 10/2001 | Hu | 361/679.02 |
| 6,411,506 B1 | 6/2002 | Hipp et al. | |
| 6,661,671 B1 * | 12/2003 | Franke et al. | 361/752 |
| 6,785,133 B2 | 8/2004 | Barringer et al. | |
| 7,042,737 B1 | 5/2006 | Woolsey et al. | |
| 7,079,381 B2 | 7/2006 | Brehm et al. | |
| 7,097,495 B2 | 8/2006 | Sweetland | |
| 7,225,295 B2 * | 5/2007 | Trakic et al. | 711/115 |
| 7,254,038 B2 * | 8/2007 | Drako | 361/752 |

OTHER PUBLICATIONS

High Speed Backplane Interconnect Solutions 2007, 6 pages.
Z-PACK TinMan Connector System Aug. 2010, 38 pages.

\* cited by examiner

*Primary Examiner* — Hung S Bui

(57) ABSTRACT

A communication module including a circuit board having leading and trailing ends and a module axis extending therebetween. The communication module also includes a support wall that is coupled to the circuit board proximate to the leading end. The support wall extends transverse to the module axis and has a wall opening. The communication module also includes an electrical connector that is held by the support wall within the wall opening and has a mating face. The communication module also includes a board interconnect coupled to the circuit board. The communication module also includes a flex cable assembly that is coupled at one end to the array of electrical contacts and at an opposite end to the board interconnect. The electrical connector is permitted to float within the wall opening relative to the support wall.

20 Claims, 6 Drawing Sheets

COMMUNICATION MODULES HAVING CONNECTORS ON A LEADING END AND SYSTEMS INCLUDING THE SAME

BACKGROUND OF THE INVENTION

The subject matter described and/or illustrated herein relates generally to communication modules with electrical connectors proximate to a leading end and communication systems that include such modules.

Some communication systems, such as blade server systems, include large backplanes or midplanes with several communication modules coupled thereto. Known communication modules include a circuit board having an electrical connector(s) mounted on a leading edge of the circuit board. The communication module is configured to directly engage the backplane or midplane circuit board with the electrical connector. However, challenges have arisen in maintaining signal quality. Signal quality can be based upon various factors including the speed at which the signals are transmitted, the length of the traces in the circuit board, and the number of interfaces that the signals are transmitted through. Signal quality can be negatively affected when the traces are longer and when there are more interfaces.

Other challenges may arise for midplane-type communication systems. The communication modules and other components of the communication system can generate more heat as the transmission speed increases. Since airflow is restricted by the midplane circuit board, the communication system may have limited abilities for removing heat from the system. In addition to the above, it may be desirable to make communication systems easier to reconfigure by adding/removing/replacing the communication modules so that the communication system can be updated and maintained.

Accordingly, there is a need for communication systems having communication modules that address one or more of the above challenges.

BRIEF DESCRIPTION OF THE INVENTION

In one embodiment, a communication module is provided that includes a circuit board having leading and trailing ends and a module axis extending therebetween. The communication module also includes a support wall that is coupled to the circuit board proximate to the leading end. The support wall extends transverse to the module axis and has a wall opening. The communication module also includes an electrical connector that has an array of electrical contacts. The electrical connector is held by the support wall within the wall opening and has a mating face. The communication module also includes a board interconnect coupled to the circuit board. The communication module also includes a flex cable assembly that is coupled at one end to the array of electrical contacts and at an opposite end to the board interconnect. The electrical connector is configured to communicatively couple to a mating connector when the leading end is moved in a mating direction along the module axis. The electrical connector is permitted to float within the wall opening relative to the support wall when engaging the other connector. The flex cable assembly has a length that permits the electrical connector to float within the wall opening.

In another embodiment, a communication system is provided that includes a system chassis and a first communication module that is coupled to the system chassis. The first communication module has leading and trailing ends with a module axis extending therebetween. The first communication module includes a mating connector having an array of electrical contacts. The communication system also includes a second communication module that is configured to be removably held by the system chassis. The second communication module includes a circuit board having leading and trailing ends with a module axis extending therebetween. The second communication module also includes a support wall that is coupled to the circuit board proximate to the leading end. The support wall extends transverse to the module axis and has a wall opening. The second communication module also includes an electrical connector having an array of electrical contacts. The electrical connector is held by the support wall within the wall opening and has a mating face. The second communication module also includes a board interconnect coupled to the circuit board. The second communication module also includes a flex cable assembly that is coupled at one end to the array of electrical contacts and at an opposite end to the board interconnect. The electrical connector is configured to directly engage the mating connector when the leading end is moved in a mating direction along the module axis. The electrical connector is permitted to float within the wall opening relative to the support wall when engaging the mating connector. The flex cable assembly has a length that permits the electrical connector to float within the wall opening.

In yet another embodiment, a communication system is provided that includes a system chassis and a switch module that is configured to be slidably held by the system chassis. The switch module has leading and trailing ends with a module axis extending therebetween. The switch module includes mating connectors located proximate to the leading end. The communication system also includes first and second server modules that are configured to be slidably held by the system chassis. Each of said first and second server modules has leading and trailing ends with a module axis extending therebetween. Each of said first and second server modules includes a floatable electrical connector located proximate to the leading end of the respective server module. The electrical connectors are configured to float relative to the system chassis when the electrical connectors engage the mating connectors. The module axes of the switch module and said first and second server modules extending parallel to one another when engaged.

DETAILED DESCRIPTION OF THE INVENTION

Figure 1:
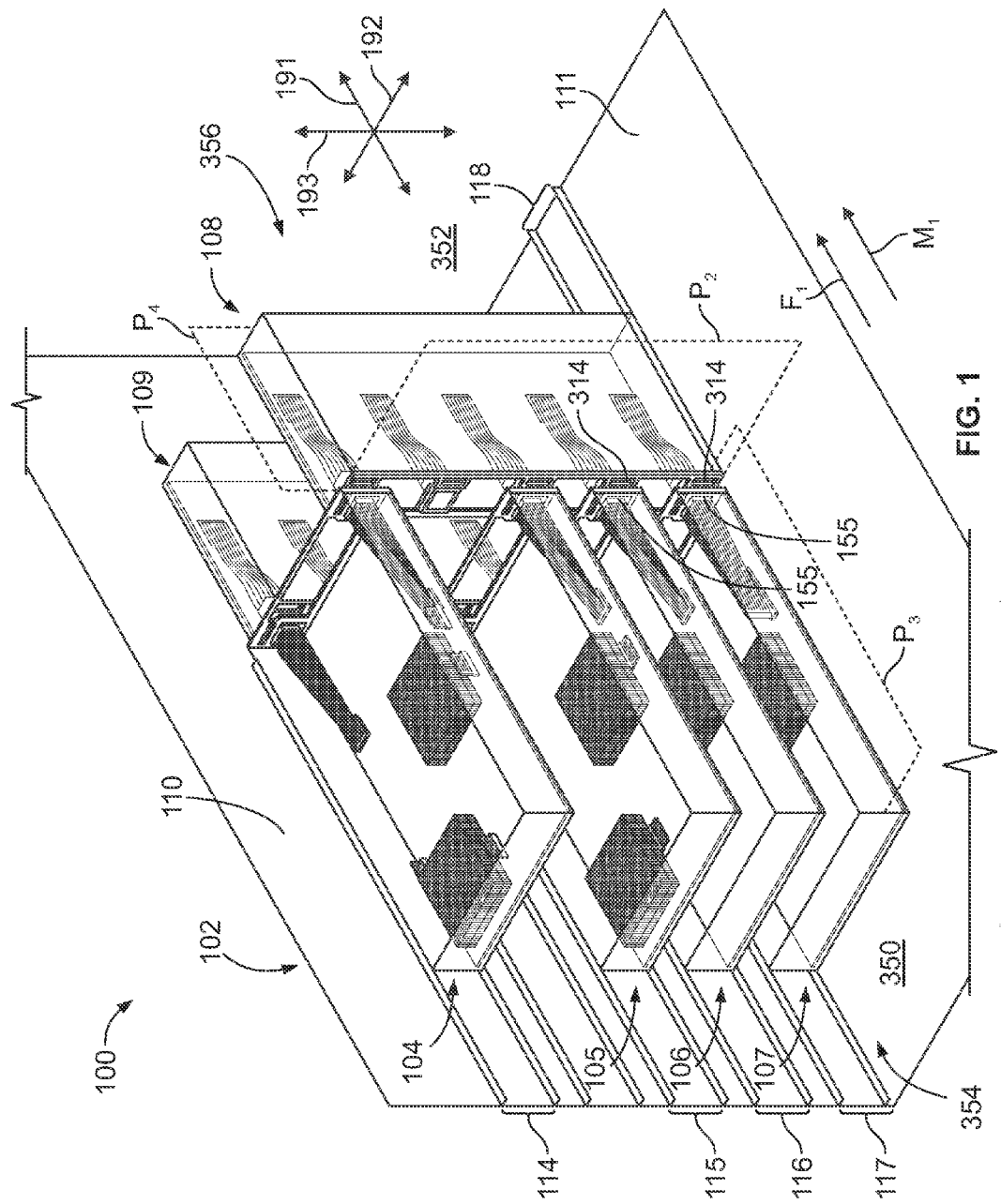
FIG. 1 is a perspective view of a communication system formed in accordance with one embodiment.

FIG. 1 is a perspective view of a communication system 100 formed in accordance with one embodiment. The communication system 100 includes a plurality of communication modules 104-109 supported by a system chassis 102. The communication system 100 may include additional devices or components that are not shown in FIG. 1, such as cooling fans, a power supply, and other communication components. In particular embodiments, the communication system 100 is a blade server system in which some or all of the communication modules 104-109 are readily separable from the system chassis 102. However, the communication system 100 may be other types of communication systems that use communication modules. In some embodiments, the communication modules 104-107 may be referred to as first communication modules or server modules and the communication modules 108-109 may be referred to as second communication modules or switch modules.

The system chassis 102 holds the communication modules 104-109 in predetermined mating positions with respect to each other. In FIG. 1, the communication system 100 and its components are oriented with respect to mutually perpendicular axes 191-193 including an insertion axis 191 and orientation axes 192, 193. The system chassis 102 includes a plurality of chassis walls 110, 111. For illustrative purposes, only a portion of the system chassis 102 is shown. For instance, the system chassis 102 may include additional walls (not shown) including shelves or internal walls for supporting the communication modules 104-109. By way of example, the system chassis 102 may include another chassis wall that faces the chassis wall 110 in a direction along the orientation axis 192. The communication modules 104-107 may be located between the chassis wall 110 and the other chassis wall. Although not shown, the system chassis 102 can also include a top chassis wall that faces the chassis wall 111.

The chassis walls 110, 111 have a plurality of guide features 114-118 that are configured to engage respective communication modules 104-108. For example, each of the guide features 114-118 may include one or more guide rails that directly engages the respective communication module. In other embodiments, the guide features 114-118 may constitute one or more recesses or slots that receive a portion of the respective communication module. The guide features 114-117 direct the respective communication modules 104-107 to the corresponding mating positions when the respective communication module is advanced along the insertion axis 191 in a mating direction $M_1$. The guide feature 118 directs the communication module 108 along the insertion axis 191 in a direction that is opposite the mating direction $M_1$. Although the communication modules 104-108 move only in a linear manner in the illustrated embodiment, the guide features 114-118 may be configured to direct the communication modules 104-108 in a non-linear manner. In other embodiments, the chassis walls 110, 111 do not have guide features for directing the communication modules 104-108. For example, the communication modules 104-108 can be directly coupled to a midplane or backplane circuit board without using guide features along the chassis walls.

Figure 2:
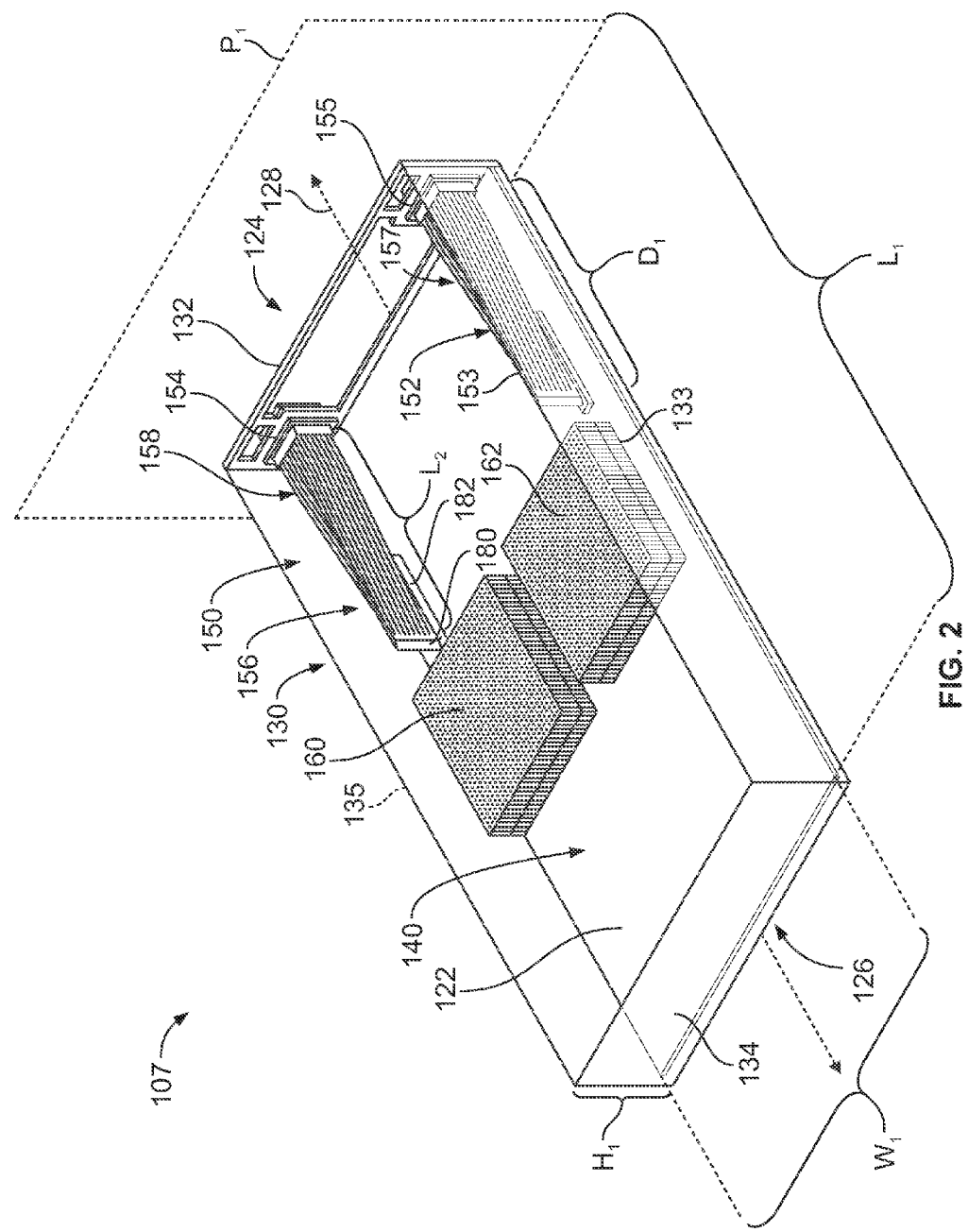
FIG. 2 is a rear perspective view of a communication module formed in accordance with one embodiment that may be used with the communication system of FIG. 1.

FIG. 2 illustrates the communication module 107. However, the communication modules 104-106, 108, and 109 (FIG. 1) may have similar features. The communication module 107 has leading and trailing ends 124, 126 and a circuit board 122 that extends along a module axis 128 between the leading and trailing ends 124, 126. The module axis 128 may extend parallel to the insertion axis 191 (FIG. 1) when the communication module 107 is in the mating position. The circuit board 122 has a length $L_1$, which is the longest dimension of the circuit board 122 and is measured along the module axis 128. The circuit board 122 also has a width $W_1$ and a height $H_1$. The $W_1$ and height $H_1$ extend parallel to the orientation axes 192, 193 (FIG. 1), respectively, when the communication module 107 is in the mating position. The communication module 107 also includes a support wall 132 that is coupled to the circuit board 122 proximate to the leading end 124. The support wall 132 extends along a plane $P_1$ that is transverse to the module axis 128.

In some embodiments, the communication module 107 includes a module housing 130 having a plurality of housing walls. For example, the module housing 130 may include the support wall 132 and other housing walls 133-135. The housing wall 134 may be a trailing wall that is located opposite the support wall 132 at the trailing end 126. The housing walls 133, 135 may be sidewalls that extend between the support wall 132 and the housing wall 134 along the module axis 128. In some embodiments, the circuit board 122 may function as an additional housing wall. In the illustrated embodiment, the support wall 132, the housing walls 133-135, and the circuit board 122 define a housing cavity 140. Optionally, the module housing 130 may include another housing wall (not shown) that functions as a top wall that encloses the housing cavity 140.

In an exemplary embodiment, the communication module 107 includes electrical connector assemblies 150, 152. In other embodiments, the communication module 107 may include only one electrical connector assembly or more than two electrical connector assemblies. As shown, the electrical connector assembly 150 can include an electrical connector 154, a board interconnect 156, and a flex cable assembly 158 that extends therebetween. The electrical connector 154 is configured to be held by the support wall 132. As will be described in greater detail below, the electrical connector 154 is permitted to float relative to the support wall 132, the circuit board 122, and/or the system chassis 102 (FIG. 1). The electrical connector assembly 152 may also include an electrical connector 155, a board interconnect 153, and a flex cable assembly 157 that extends therebetween. The electrical connector 155, the board interconnect 153, and the flex cable assembly 157 may be similar to the corresponding components of the electrical connector assembly 150.

The flex cable assembly 158 is coupled at one end to the electrical connector 154 and at an opposite end to the board interconnect 156. The flex cable assembly 158 extends from the electrical connector 154 toward the trailing end 126 and couples to the board interconnect 156 at a location between the leading end 124 and the trailing end 126. The board interconnect 156 is mounted to the circuit board 122. At least a portion of the flex cable assembly 158 extends generally along the module axis 128 toward the trailing end 126. For example, the flex cable assembly 158 may have a length $L_2$. The length $L_2$ may extend from the electrical connector 154 to the board interconnect 156. In some embodiments, the length $L_2$ is at least about 25% of the length $L_1$. In more particular embodiments, the length $L_2$ is at least about 33% or at least about 50% of the length $L_1$. The length $L_2$ of the flex cable assembly 158 can be configured to include slack when coupled to the electrical connector 154 so that the electrical connector 154 is permitted to float.

During a mating operation, the flex cable assembly 158 is capable of moving (e.g., flexing, bending, straightening) without damaging the conductive pathways of the flex cable assembly 158. Various kinds of flex cable assemblies can be used. In the illustrated embodiment, the flex cable assembly 158 comprises a plurality of separate wires 159 (shown in FIG. 3). In such embodiments, the flex cable assembly 158 may be characterized as a cable bundle. Each wire 159 may include only one conductor or a pair of conductors (e.g., twisted differential pair of conductors, twin-axial cables, and the like). In other embodiments, a single sheath or jacket may cover the wires 159 for a portion of the distance between the board interconnect 156 and the electrical connector 154. The flex cable assembly 158 can also be similar to a ribbon cable. In other embodiments, the flex cable assembly 158 may include a flex circuit that comprises stacked layers of a flexible dielectric material with conductive pathways deposited therebetween.

In particular embodiments, the wires 159 are coaxial cables. Each of the coaxial cables may include an inner conductor surrounded by an outer sleeve or jacket. The inner conductors can be terminated to corresponding electrical contacts of the electrical connector 154. The coaxial cables may define a cable bundle that extends between the electrical connector 154 and the board interconnect 156.

The board interconnect 156 includes a removable card 180 and a card receptacle 182. The removable card 180 has opposite sides where the individual wires 159 are mechanically and electrically coupled thereto. For example, the conductors in the wires 159 may be soldered to the opposite sides. Alternatively, the wires 159 may be coupled to the removable card 180 using an insulation-displacement connection (IDC). As shown in FIG. 2, the removable card 180 may be oriented to be upright with respect to the circuit board 122 with the longest dimension extending along the module axis 128 and the shortest dimension extending transverse to the module axis 128 along the orientation axis 192 (FIG. 1). In some embodiments, the removable card 180 is positioned to direct or allow airflow along the circuit board 122 in a substantially predetermined manner.

The card receptacle 182 is configured to be mounted onto the circuit board 122. The card receptacle 182 may have compliant pins that are inserted into corresponding thru-holes of the circuit board 122. The card receptacle 182 may also include a cavity or recess that is configured to receive the removable card 180. The removable card 180 is readily separable from the card receptacle 182. For example, the removable card 180 may be held within the recess through only an interference fit. When the removable card 180 is removed, the removable card 180 and the card receptacle 182 are not damaged or destroyed.

Although the board interconnect 156 is illustrated as including the removable card 180 and the card receptacle 182, the board interconnect 156 may have different elements/components in alternative embodiments that communicatively couple the electrical connector 154 to the circuit board 122. For example, the board interconnect 156 may include a first electrical connector that couples to the wires 159 and a second electrical connector that is mounted to the circuit board 122 and is configured to receive the first electrical connector.

In some embodiments, the communication module 107 includes electronic packages or devices 160, 162. The electronic devices 160, 162 are configured to receive input data signals (e.g., from a corresponding electrical connector assembly) process the input data signals, and provide output data signals. The electronic devices 160, 162 may include, for example, processors or application-specific integrated circuits (ASICs) that are configured to process the input data signals in a predetermined manner. In some embodiments, the electronic devices 160, 162 are located to facilitate airflow along the communication module 107. By way of example, the electronic devices 160, 162 may be spaced apart from each other and other module components (e.g., other electrical connectors and the like) but located proximate to a corresponding board interconnect. For instance, the board interconnect 156 can be located proximate to (e.g., adjacent to or directly attached to) the electronic device 160 to reduce signal loss when the data signals are transmitted therebetween.

In some embodiments, the electronic devices are located away from the leading end 124. For example, the electronic device 162 can be located a distance $D_1$ away from the leading end 124. The distance $D_1$ may be at least about 25% of the length $L_1$. In more particular embodiments, the distance $D_1$ is at least about 33% or at least about 50% of the length $L_1$. The distance $D_1$ can also be greater than 50% of the length $L_1$.

Figure 3:
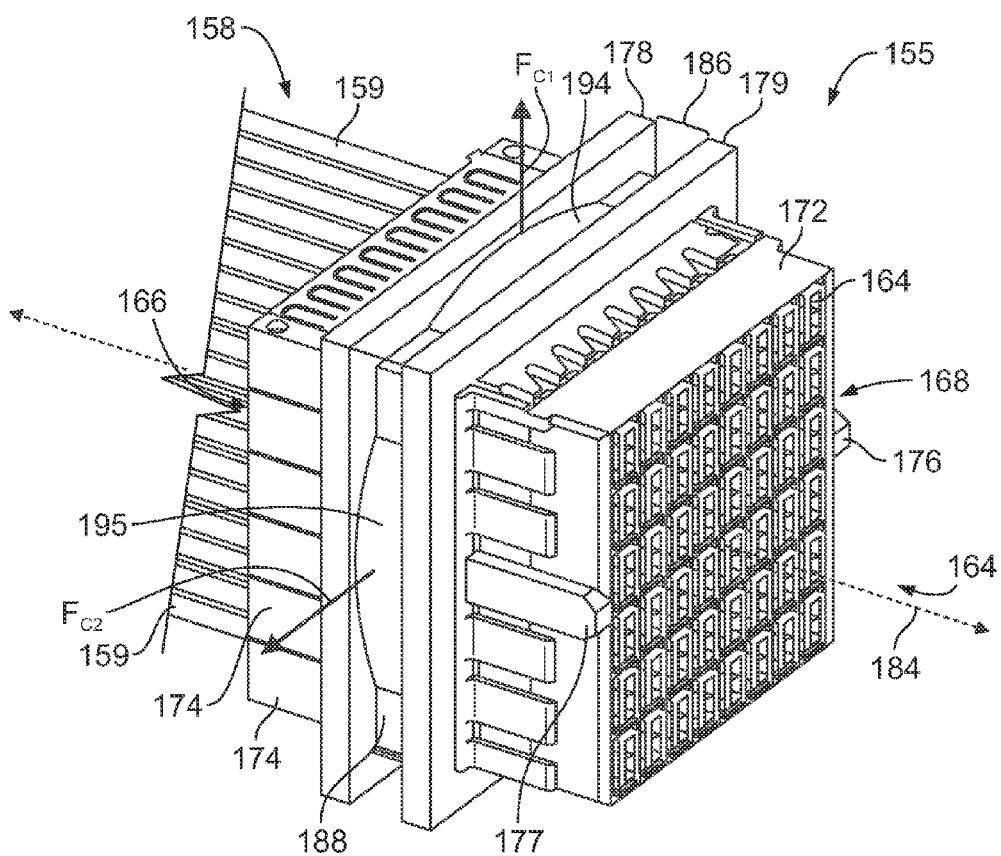
FIG. 3 is an isolated view of an electrical connector that may be used with the communication module of FIG. 2.

FIG. 3 is a perspective view of the electrical connector 155. The electrical connector 154 (FIG. 2) can include similar components as the electrical connector 155 described below. The electrical connector 155 has a mating face 164 and a loading side 166. The electrical connector 155 includes an array 168 of electrical contacts (e.g., signal and ground contacts) that are accessible through the mating face 164. The electrical connector 155 is configured to electrically engage a mating connector, such as the electrical connector 314 shown in FIG. 10. The electrical contacts of the array 168 are arranged in rows and columns and the electrical contacts may include differential pairs arranged with respect to one another to improve electrical performance. The array 168 of electrical contacts is configured to engage a corresponding array of electrical contacts of the mating connector.

In particular embodiments, the electrical connector 155 is a high-density electrical connector having greater than 10 signal lines per square centimeter ($cm^2$). The electrical connector 155 may also be capable of transmitting at high speeds such as greater than 10 Gb/s or greater than 12 Gb/s. By way of example only, the electrical connector 155 may be similar to Z-Pack TinMan® connectors developed by Tyco Electronics.

Figure 7:
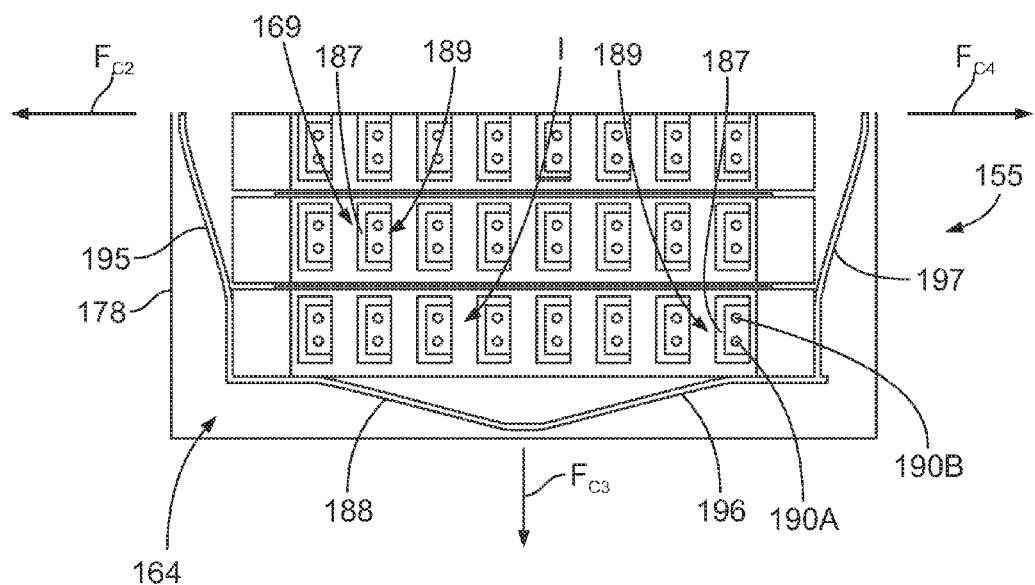
FIG. 7 is a partial front view of the electrical connector of FIG. 3.

In the illustrated embodiment, the mating face 164 has an array of apertures or sockets 169 in which each socket 169 houses at least one electrical contact. As shown in FIG. 7, in some embodiments, each socket 169 houses one differential pair 189 and, optionally, can include a ground shield 187 that shields the differential pair 189 from other differential pairs 189. Each of the differential pairs 189 include electrical contacts 190A and 190B and a corresponding ground shield (or contact) 187 that at least partially surrounds the electrical contacts 190A, 190B. In some embodiments, each wire 159 (FIG. 3) includes a twin-axial cable having a pair of inner conductors (not shown) that are terminated to the electrical contacts 190A, 190B of one differential pair 189. In other embodiments, the electrical contacts may be exposed (e.g., pin contacts). Returning to FIG. 3, the loading side 166 is configured to engage the wires 159 of the flex cable assembly 158. The loading side 166 permits each wire 159 to electrically connect with one of the electrical contacts or differential pairs. In an exemplary embodiment, the mating face 164 and the loading side 166 face in opposite directions.

The electrical connector 155 can include a connector housing 172 and a plurality of contact modules 174 that are stacked with respect to each other and are held by the connector housing 172. The connector housing 172 includes a dielectric material that is formed to include various features, such as the apertures 169. The connector housing 172 may also include one or more alignment features 176, 177 and one or more retainers 178, 179. The alignment features 176, 177 are configured to redirect the electrical connector 155 when the electrical connector 155 engages the mating connector.

The electrical connector 155 is oriented with respect to a central axis 184 that extends between the mating face 164 and the loading side 166 and parallel to the module axis 128 (FIG. 2) when the electrical connector 155 is mated to the mating connector. The retainers 178, 179 extend around the central axis 184 along a periphery of the electrical connector 155. The retainers 178, 179 may extend completely around the central axis 184 or only along portions of the electrical connector 155.

In those embodiments that include the two retainers 178, 179, the retainers 178, 179 may be separated by a spacing 186. A biasing member 188 can be located between the retainers 178, 179. The biasing member 188 includes a plurality of spring elements 194, 195. Each of the spring elements 194, 195 provides a resistive centering force $F_{C1}$, $F_{C2}$, respectively, when the respective spring element is pressed toward the electrical connector 155. The centering forces $F_{C1}$, $F_{C2}$ are in directions away from the central axis 184. Spring elements 196, 197 are shown in FIG. 7 and provide centering forces $F_{C3}$ and $F_{C4}$, respectively.

Figure 4:
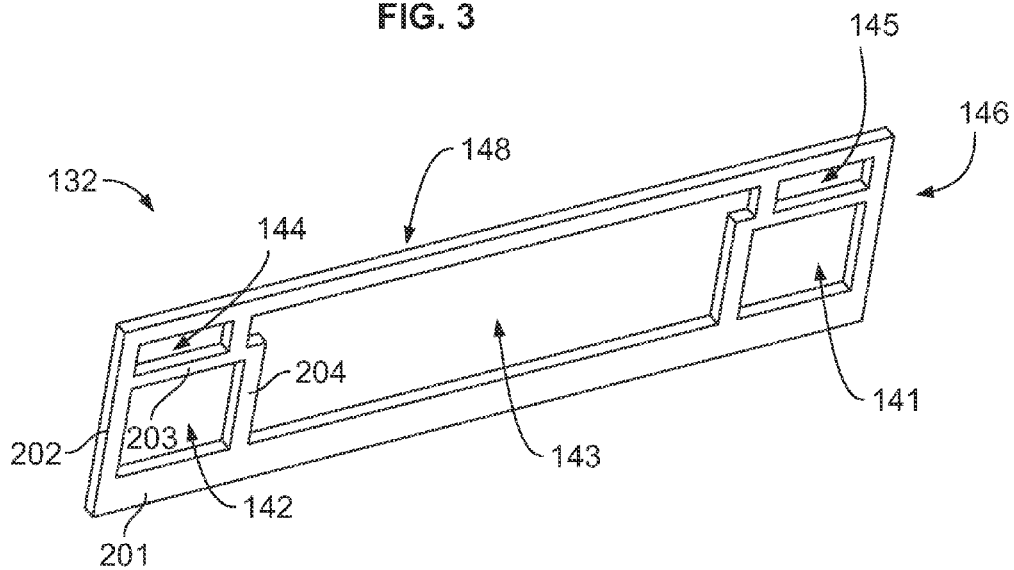
FIG. 4 is a perspective view of a support wall that may be used with the communication module of FIG. 2.

FIG. 4 is a perspective view of the support wall 132. The support wall 132 has opposite first and second sides 146, 148. The first side 146 is forward-facing and faces the mating direction $M_1$ (FIG. 1). In an exemplary embodiment, the support wall 132 has a plurality of wall openings 141-145. The wall openings 141, 142 may be referred to as connector openings because the wall openings 141, 142 are configured to hold the electrical connectors 154, 155 (FIG. 2), respectively. The wall openings 143-145 may be referred to as access or fluid openings. In some cases, the access openings 143-145 are sized, shaped, and located to facilitate airflow in a predetermined manner.

In an exemplary embodiment, the support wall 132 constitutes a structural frame. For example, the support wall 132 may consist essentially of bars or rods that define the wall openings 141-145. In other embodiments, the support wall 132 may include more continuous portions. For example, the wall opening 143 may not exist and, instead, a continuous piece of material may be located there. The support wall 132 may also include fewer wall openings (e.g., only one or two wall openings) or more wall openings.

The wall openings 141, 142 may be defined by wall sections of the support wall. For example, the wall opening 141 is defined by wall sections 201-204. The wall opening 142 is sized and shaped relative to the electrical connector 155 to permit the electrical connector 155 to move within the wall opening 142. In some embodiments, the wall section 204 is removable so that the electrical connector 155 can be inserted therein. In other embodiments, the support wall 132 is integrally formed during, for example, a molding or die-casting process.

Figure 6:
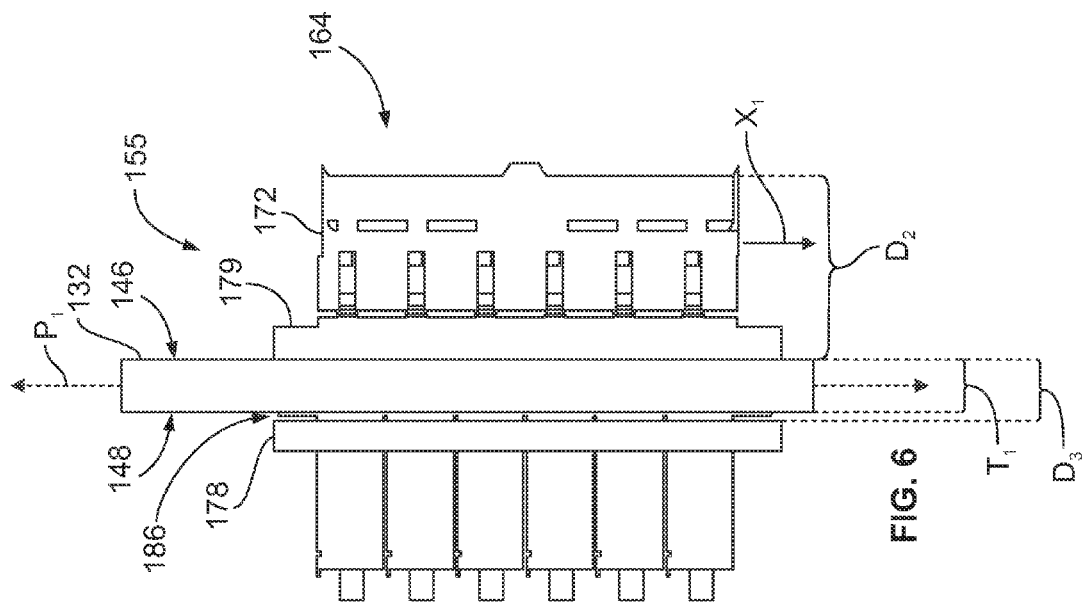
FIG. 6 is a side view of a portion of the communication module of FIG. 2.
Figure 5:
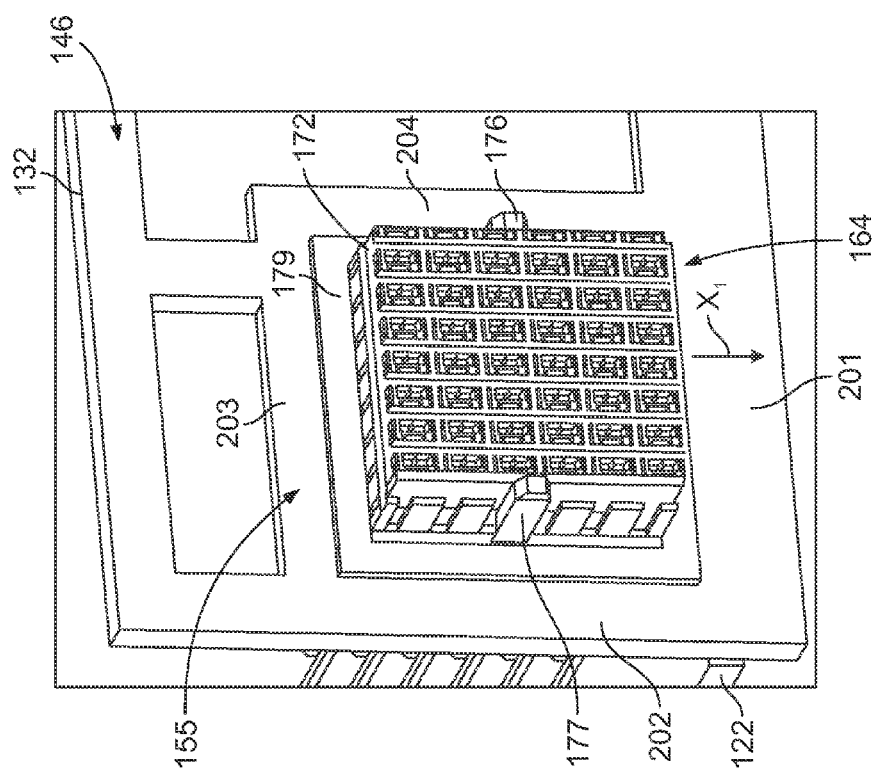
FIG. 5 is a front perspective view of a portion of the communication module of FIG. 2.

FIGS. 5 and 6 show perspective and side views, respectively, of the electrical connector 155 and the support wall 132 prior to a mating operation with the mating connector. The electrical connector 155 is held within the wall opening 142 (FIG. 4). The mating face 164 projects a distance $D_2$ (FIG. 6) from the first side 146 of the support wall 132 so that the connector housing 172 is permitted to engage the mating connector. The alignment features 176, 177 (FIG. 5) can engage corresponding recesses of the mating connector. The retainer 179 interfaces with the first side 146 of the support wall 132, and the retainer 178 (FIG. 6) interfaces with the second side 148 (FIG. 6).

As shown in FIG. 5, the wall sections 201-204 are positioned to extend around the electrical connector 155. When the electrical connector 155 is in an unengaged or relaxed position, the biasing member 188 (FIG. 3) may engage the wall sections 201-204. Each of the spring elements 194, 195 (FIG. 3) may engage a respective wall section to approximately center the electrical connector 155 in the relaxed position.

During the mating operation, the communication module 107 (FIG. 1) is inserted into the system chassis 102 (FIG. 1) and engages the guide feature 117 (FIG. 1) that is configured to direct the communication module 107 toward the mating position. For various reasons, the electrical connector 155 may not be sufficiently aligned with the mating connector as the electrical connector 155 approaches the mating position. When the connector housing 172 engages the mating connector in a misaligned manner, the mating connector may provide a force that moves the electrical connector 155 in at least one direction that is transverse to the module axis 128 (FIG. 2). In an exemplary embodiment, the electrical connector 155 is capable of moving in any direction along the plane $P_1$ (FIG. 6).

As the electrical connector 155 moves along the plane $P_1$, the wall sections 201-204 may relatively move within or along the spacing 186 (FIG. 6). For example, if the electrical connector 155 were pushed in a direction indicated by $X_1$ in FIGS. 5 and 6, the electrical connector 155 would move toward the wall section 201. The spring element 196 (FIG. 7) of the biasing member 188 can engage the wall section 201 and provide a resistive centering force $F_{C3}$. In other words, the electrical connector 155 is movable with respect to the support wall 132 within the wall opening 142 and may advance closer to the one or more of the wall sections 201-204 when moved along the plane $P_1$. As shown in FIG. 6, the spacing 186 may extend a separation distance $D_3$ between the retainers 178, 179.

FIG. 7 is a partial front end view of the mating face 164 of the electrical connector 155. In FIG. 7, only the retainer 178 is indicated and the retainer 179 is not shown. The spring elements 195-197 of the biasing member 188 are shown. In the illustrated embodiment, each of the spring elements 195-197 provides the respective centering force $F_{C2}$-$F_{C4}$. However, in other embodiments, the biasing member 188 may include multiple spring elements in which the centering force in one direction may be provided by more than spring element. The spring elements may be coupled to one another as shown in FIG. 7, or the spring elements may be separate structures. For example, an alternative biasing member may include multiple separate spring fingers.

Figure 8:
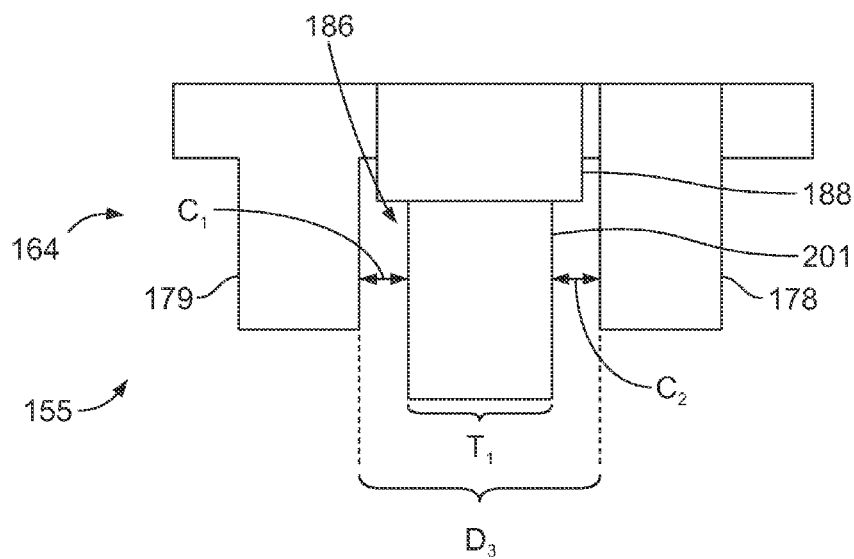
FIG. 8 is a partial side view of the electrical connector of FIG. 3 that has been enlarged to show elements in greater detail.

FIG. 8 is an enlarged partial side view of the electrical connector 155 as the wall section 201 is engaging the biasing member 188 between the retainers 178, 179 in the spacing 186. For reference, the mating face 164 is indicated in FIG. 8. Also shown, the separation distance $D_3$ is greater than the thickness $T_1$ of the wall section 201. As such, a clearance $C_1$ is provided between the retainer 179 and the wall section 201, and a clearance $C_2$ is provided between the retainer 178 and the wall section 201. In such embodiments, the electrical connector 155 is permitted to move forward (i.e., closer to the retainer 178 and away from the retainer 179) or backward (i.e., closer to the retainer 179 and away from the retainer 178). In addition, the electrical connector 155 may be permitted to rotate within the wall opening 142 in a direction that is within the plane $P_1$. For example, the electrical connector 155 may rotate about the central axis 184 (FIG. 3). Due to the clearances $C_1$ and $C_2$, the electrical connector 155 is also permitted to rotate about an axis that is perpendicular to the central axis 184. As such, the electrical connector 155 is permitted to float within the spacing 186.

Figure 9:
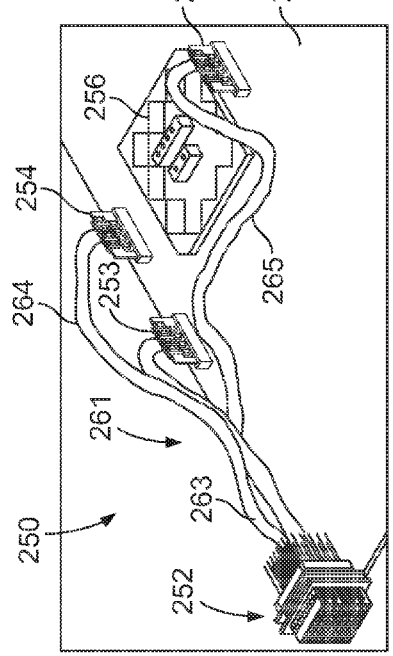
FIG. 9 is a perspective view of an electrical connector assembly formed in accordance with one embodiment.

FIG. 9 is a perspective view of an electrical connector assembly 250 formed in accordance with one embodiment. The electrical connector assembly 250 may be similar to the electrical connector assemblies 150, 152 (FIG. 2) and be used in any of the communication modules 104-109 and 107. As shown, the electrical connector assembly 250 includes an electrical connector 252, a plurality of board interconnects 253-255, and a flex cable assembly 261 comprising cable connector sub-assemblies 263-265. The board interconnects 253-255 and an electronic device 256 are mounted to a circuit board 257. Each of the cable connector sub-assemblies 263-265 communicatively couples a corresponding one of the board interconnects 253-255 to the electrical connector 252. Each of the cable connector sub-assemblies 263-265 can include a plurality of wires. In an exemplary embodiment, each cable connector sub-assembly 263-265 is coupled to one or more rows or one or more columns of electrical contacts of the electrical connector 252. In the illustrated embodiment, the electrical connector 252 is similar to the electrical connector 155 (FIG. 2) and may be floatably held by a support wall (not shown). Accordingly, more than one board interconnect can be communicatively coupled to the same electrical connector by using a flex cable assembly with multiple cable connector sub-assemblies.

Figure 10:
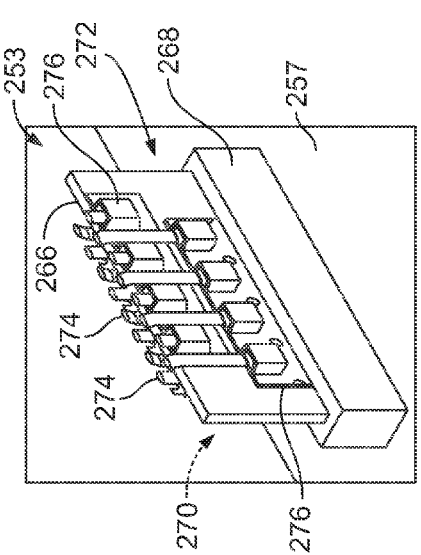
FIG. 10 is an isolated view of a board interconnect that may be used with the electrical connector assembly of FIG. 9.

FIG. 10 is an isolated view of the board interconnect 253 mounted to the circuit board 257. As shown, the board interconnect 253 may include a removable card 266 and a card receptacle 268. The removable card 266 has opposite sides 270, 272 where individual wires 274 of the cable connector sub-assembly 263 (FIG. 9) are mechanically and electrically coupled thereto. The conductors in the wires 274 may be soldered to the opposite sides 270, 272. Shields 276 are coupled to the sides 270, 272 to cover the soldered conductors of the wires 274. The card receptacle 268 can be similar to the card receptacle 182 (FIG. 2).

Figure 11:
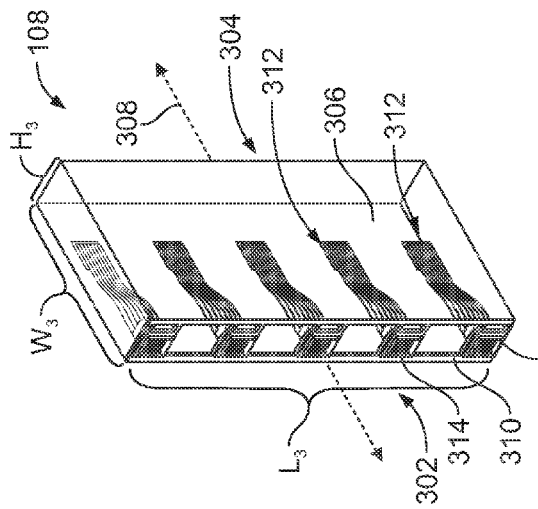
FIG. 11 is a front perspective view of a communication module formed in accordance with one embodiment.

FIG. 11 is a front perspective view of the communication module 108 formed in accordance with one embodiment. The communication module 108 may be referred to as a switch module and may be similar to the communication module 109 (FIG. 1). The communication module 108 may be configured to directly engage the communication modules 106 and 107 (FIG. 1). As shown, the communication module 108 has leading and trailing ends 302, 304 and a circuit board 306 that extends along a module axis 308 between the leading and trailing ends 302, 304. The module axis 308 may extend parallel to the insertion axis 191 (FIG. 1) when the communication module 108 is in the mating position. The circuit board 306 has a length $L_3$, which is the longest dimension of the circuit board 306 and is measured perpendicular to the module axis 308, and may also have a width $W_3$ and a height $H_3$. The $W_3$ and height $H_3$ extend parallel to the insertion axis 191 and the orientation axis 192 (FIG. 1), respectively, when the communication module 108 is in the mating position.

The communication module 108 may include a plurality of electrical connector assemblies 312 having respective electrical connectors 314. The communication module 108 also includes a support wall 310 that is coupled to the circuit board 306 proximate to the leading end 302. The support wall 310 can be similar to the support wall 132 (FIG. 2) having wall openings (e.g., connector openings and access openings). As described above with respect to the support wall 132, the support wall 310 and the wall openings may be dimensioned relative to the electrical connectors 314 so that the electrical connectors 314 are floatable with respect to the support wall 310. For example, the electrical connectors 314 can float in at least one direction that is transverse to the module axis 308.

Figure 12:
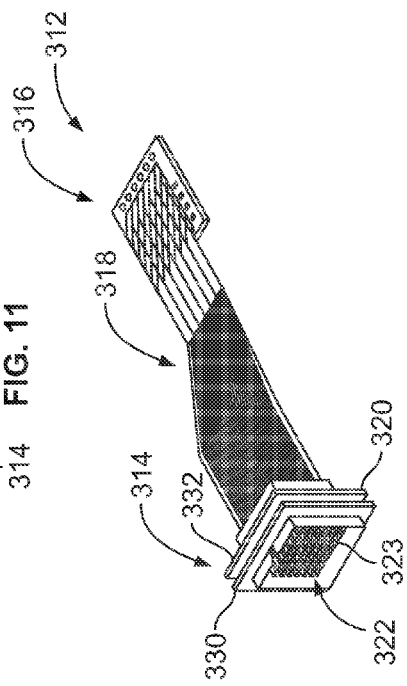
FIG. 12 is perspective view of an electrical connector assembly that may be used with the communication module of FIG. 11.

FIG. 12 is perspective view of the electrical connector assembly 312. The electrical connector assembly 312 may be similar to the electrical connector assemblies 150, 152 (FIG. 2) and include the electrical connector 314, a board interconnect 316, and a flex cable assembly 318. In some embodiments, the electrical connector 314 may be the mating connector that the electrical connector 155 (FIG. 2) engages. The electrical connector 314 includes a connector housing 320 and an array 322 of electrical contacts 323. In an exemplary embodiment, the electrical contacts 323 are pin contacts that are sized and shaped to be received by the sockets 169 (FIG. 3). The connector housing 320 includes retainers 330, 332 for gripping the support wall 310.

Returning to FIG. 1, embodiments described herein include communication systems that are configured to facilitate airflow therethrough for removing thermal energy. Embodiments described herein can also include reconfigurable communication systems in which the communication modules are readily separable and include floatable electrical/mating connectors. For example, as shown in FIG. 1, when the communication modules 104-109 are directly engaged to each other, an interface plane $P_2$ may separate the communication system 100 into first and second spatial regions 350, 352. In an exemplary embodiment, the plane $P_2$ coincides with the plane $P_1$ in FIG. 2. Unlike communication systems that include a midplane circuit board, a working gas (e.g., ambient air) may be directed through the communication system 100 from a first end 354 to a second end 356 through the plane $P_2$. Accordingly, a direction of airflow (indicated by the arrow $F_1$) may be directed orthogonal to the plane $P_2$. The airflow may be from the first end 354 to the second end 356 or in the opposite direction.

In the illustrated embodiment, each of the communication modules 104-109 directly engages at least one other communication module (also referred to as the mating module). The communication modules 104-109 may be orthogonal to the mating module as shown in FIG. 1 or, alternatively, may be co-planar to the mating module. More specifically, each of the communication modules 104-109 may be oriented to extend along an orientation plane. The orientation plane of the communication modules 104-109 may be orthogonal to or co-planar to the orientation plane of the mating module. A communication module is "oriented to extend along an orientation plane" when the two longer dimensions of the communication module extend along the orientation plane and the shortest dimension extends perpendicular to the orientation plane.

By way of one example, the communication module 107 is directly engaged to the communication module 108 in FIG. 1. The communication module 107 extends along an orientation plane $P_3$ that is parallel to a plane defined by the insertion axis 191 and the orientation axis 192. The communication module 108 extends along an orientation plane $P_4$ that is parallel to a plane defined by the insertion axis 191 and the orientation axis 193. As such, the orientation planes $P_3$, $P_4$ of the communication modules 107, 108 are orthogonal to each other and the communication modules 107, 108 have an orthogonal relationship.

As shown, the communication modules 104-109 can be oriented so that each of the communication modules 104-107 engages both of the communication modules 108, 109. By way of one particular example, the electrical connectors 314 of the communication module 108 can be configured to directly engage the electrical connector 155 of different communication modules 106, 107. In such embodiments, the module axes of the respective communication modules 106-108 extend parallel to one another. In particular embodiments, the electrical connectors 155 and the electrical connectors 314 are floatable as described above relative to the system chassis 102.

In alternative embodiments, an intervening electrical component may be used to communicatively couple the communication modules 104-109. For example, a midplane circuit board may be inserted between the communication modules 104-107 and the communication modules 108, 109 and extend along the interface plane $P_2$. In such embodiments, the communication modules 104-109 may directly engage the midplane circuit board that, in turn, communicatively couples the communication modules 104-109 to one another.

In some embodiments, the communication modules 104-107 and/or the communication modules 108, 109 are spaced apart from each other to permit air to flow therebetween. The spacings between the communication modules 104-107 and 108, 109 and the access openings of the support walls can be configured to create a turbulent airflow that is distributed in a predetermined manner across the communication modules 104-109. In alternative embodiments, the communication modules 104-107 can be stacked directly on top of each other. In such embodiments, the access openings of the support walls may permit air to flow through the respective communication module.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A communication module comprising:
   a circuit board having leading and trailing ends with a module axis extending therebetween;
   a support wall coupled to the circuit board proximate to the leading end, the support wall extending transverse to the module axis and having a wall opening;
   an electrical connector having an array of electrical contacts, the electrical connector being held by the support wall within the wall opening and having a mating face;
   a board interconnect coupled to the circuit board; and
   a flex cable assembly coupled at one end to the array of electrical contacts and at an opposite end to the board interconnect;
   wherein the electrical connector is configured to engage a mating connector when the leading end is moved in a mating direction along the module axis, the electrical connector being permitted to float within the wall opening relative to the support wall when engaging the mating connector, the flex cable assembly having a length that permits the electrical connector to float within the wall opening.

2. The communication module of claim 1, wherein the electrical connector is permitted to float in at least one direction that is transverse to the module axis.

3. The communication module of claim 1, wherein the electrical connector is permitted to float in any direction along a plane that is transverse to the module axis.

4. The communication module of claim 1, further comprising an electronic device configured to receive and process input data signals and to provide output data signals, the electronic device being mounted to the circuit board.

5. The communication module of claim 1, wherein the flex cable assembly extends from the electrical connector toward the trailing end and communicatively couples to the circuit board at a location between the leading end and the trailing end, wherein the circuit board has a length, the length of the flex cable assembly being at least about 25% the length of the circuit board.

6. The communication module of claim 1, wherein the electrical connector comprises a plurality of the electrical connectors and the support wall comprises a plurality of the wall openings, wherein the wall openings include an access opening that extends between adjacent electrical connectors, the access opening permitting airflow therethrough.

7. The communication module of claim 1, wherein the flex cable assembly includes a plurality of coaxial cables, the coaxial cables having inner conductors terminated to corresponding electrical contacts, the coaxial cables defining a cable bundle that extends between the electrical connector and the circuit board.

8. The communication module of claim 1, wherein the flex cable assembly comprises a plurality of cable connector sub-assemblies, each cable connector sub-assembly being coupled to a different board interconnect mounted to the circuit board.

9. The communication module of claim 1, wherein the electrical contacts are arranged as differential pairs, the array of electrical contacts having greater than 10 signals lines per square centimeter at the mating face.

10. The communication module of claim 9, wherein the electrical connector is configured to transmit at a speed greater than 12 gigabits per second.

11. The communication module of claim 1, wherein the electrical connector includes a connector housing and a biasing member coupled to the connector housing, the support wall extending along a plane that is transverse to the module axis, wherein the biasing member engages the support wall when the electrical connector is moved along the plane, the biasing member providing a resistive force in a direction that is parallel to the plane when the electrical connector is moved along the plane.

12. The communication module of claim 1, wherein the electrical connector includes a connector housing and a biasing member coupled to the connector housing, the biasing member engaging the support wall to center the electrical connector within the wall opening.

13. A communication module comprising:
a circuit board having leading and trailing ends with a module axis extending therebetween;
a support wall coupled to the circuit board proximate to the leading end, the support wall extending transverse to the module axis and having a wall opening;
an electrical connector having an array of electrical contacts, the electrical connector being held by the support wall within the wall opening and having a mating face;
a board interconnect coupled to the circuit board; and
a flex cable assembly coupled at one end to the array of electrical contacts and at an opposite end to the board interconnect;
wherein the electrical connector is configured to engage a mating connector when the leading end is moved in a mating direction along the module axis, the electrical connector being permitted to float within the wall opening relative to the support wall when engaging the mating connector, the flex cable assembly having a length that permits the electrical connector to float within the wall opening;
wherein the electrical contacts are arranged as differential pairs, the electrical connector having ground shields that shield the differential pairs, the flex cable assembly comprising a plurality of twin-axial cables in which each twin-axial cable is communicatively coupled to the electrical contacts of one differential pair.

14. A communication system comprising:
a system chassis;
a switch module configured to be slidably held by the system chassis, the switch module having leading and trailing ends with a corresponding module axis extending therebetween, the switch module including mating connectors located proximate to the leading end; and
first and second server modules configured to be slidably held by the system chassis, each of said first and second server modules having leading and trailing ends with a corresponding module axis extending therebetween, each of said first and second server modules including a floatable electrical connector located proximate to the leading end of the respective server module;
wherein the electrical connectors are configured to float relative to the system chassis when the electrical connectors engage the mating connectors, the module axes of the switch module and said first and second server modules extending parallel to one another when engaged;
wherein each of said first and second server modules has an orthogonal relationship with respect to the switch module.

15. The communication system of claim 14, wherein the electrical connectors are floatable in at least one direction that is perpendicular to the corresponding module axes.

16. The communication system of claim 14, wherein each of the first and second server modules has a support wall that holds the electrical connector.

17. The communication system of claim 14, wherein the mating connectors of the switch module are floatable with respect to the system chassis.

18. The communication system of claim 14, wherein each of the first and second server modules has a circuit board and a support wall coupled to the circuit board, the support wall including a wall opening, the electrical connectors of the first and second server modules having respective arrays of electrical contacts and being held within the wall opening of the corresponding support wall, each of the first and second server modules further comprising a flex cable assembly that communicatively couples the corresponding electrical connector to the corresponding circuit board, wherein the electrical connectors are permitted to float along a plane that extends along the support wall.

19. The communication system of claim 18, wherein the electrical contacts are arranged as differential pairs within each of the corresponding arrays and wherein each of the corresponding arrays has greater than 10 signals lines per square centimeter.

20. The communication module of claim 19, wherein each of the electrical connectors is configured to transmit at a speed greater than 12 gigabits per second.

* * * * *